United States Patent
Hofmann et al.

[11] Patent Number: 6,034,984
[45] Date of Patent: Mar. 7, 2000

[54] TANGENTIAL FAN WITH CUTOFF ASSEMBLY AND VIBRATION CONTROL FOR ELECTRIC DISCHARGE LASER

[75] Inventors: Thomas Hofmann, San Diego; James K. Howey, Vista; Robert A. Shannon, El Cajon; Richard C. Ujazdowski, San Diego; Tom A. Watson, Carlsbad; R. Kyle Webb, Escondido, all of Calif.

[73] Assignee: Cymer, Inc., San Diego, Calif.

[21] Appl. No.: 09/310,786

[22] Filed: May 12, 1999

Related U.S. Application Data

[63] Continuation-in-part of application No. 09/143,633, Aug. 28, 1998.

[51] Int. Cl.[7] .................................................... H01S 3/22
[52] U.S. Cl. ............................................................. 372/58
[58] Field of Search ................................................ 372/58

[56] References Cited

PUBLICATIONS

Hi–Tech Blowers,Inc; Catalog;525 Northern Blvd. Great Neck NY 11021.

*Primary Examiner*—Leon Scott, Jr.
*Attorney, Agent, or Firm*—William B. Tiffany; John R. Ross

[57] ABSTRACT

A tangential fan and cutoff assembly for recirculating a lasing gas mixture has blade members, which vary in circumferential position stepwise from end to end, and/or a tapered anode assembly. The number of blade members can be constant or variable between ends. The circumferential position of blade members can shift monotonically or reversibly between ends. Blade members are stiffened by optimally selecting the number and placement of hub members to control the natural vibration frequency of the fan. Methods of forming tangential fans include casting, and machining from a solid block. Monolithic structures can be joined, typically by electron-beam welding. Casting, welding, and machining processes introduce no additional contaminants. Tangential fans produced have mechanical rigidity, accurate tolerances, and low contaminant concentrations. Blade members can be formed into air foil shapes.

9 Claims, 11 Drawing Sheets

TANGENTIAL FAN WITH CUTOFF ASSEMBLY AND VIBRATION CONTROL FOR ELECTRIC DISCHARGE LASER

CROSS REFERENCE TO RELATED APPLICATIONS

This application is a Continuation In Part of U.S. application Ser. No. 09/143,633, filed Aug. 28, 1998, entitled "Tangential Fan For Excimer Laser", by Thomas Hofmann, et al. This application is also related to U.S. application Ser. No. 09/143,040, filed Aug. 28, 1998, entitled "Twisted Blade Tangential Fan For Excimer Laser," by Thomas Hofmann, commonly assigned. The specifications of the above applications are incorporated herein by reference in their entirety. This application is further related to U.S. application Ser. No 09/311,680 [Docket No. 99-0014-01], entitled "Soldered Fan Assembly For Electric Discharge Laser," by Thomas Hofmann, James K. Howey, et al., commonly assigned and filed herewith, the specification of which is incorporated herein by reference in its entirety.

FIELD OF THE INVENTION

The present invention relates generally to tangential fans, particularly tangential fans for producing gas flow in a gas laser chamber, and more particularly tangential fans for producing gas flow in excimer lasers and other pulse gas discharge lasers.

BACKGROUND

Transversely excited (TE) pulsed gas discharge lasers commonly include a tangential fan to recirculate lasing gas inside a laser chamber. FIGS. 1a and 1b are cross-sectional end and side views respectively showing the inner structure of a laser chamber 100 in a conventional TE excimer laser (see Akins et al., U.S. Pat. No. 4,959,840, issued Sep. 25, 1990, and incorporated herein by reference in its entirety). A laser enclosure 102 provides isolation between a laser chamber interior 105 and the exterior 110. Typically enclosure 102 is formed by a pair of half enclosure members 112 and 114 (see FIG. 1a), which are coupled together and sealed using an o-ring seal 116, extending along a perimeter of enclosure 102. Laser chamber interior 105 is filled to a predetermined pressure with a lasing gas 108. A pulsed gas discharge is generated in a discharge region 122 by a high voltage pulse applied between a cathode assembly 118 and an anode assembly 120. The pulsed gas discharge typically produces excited argon fluoride, krypton fluoride, or fluorine molecules, which generate laser pulse output energy. The pulse output energy propagates from discharge region 122 through an optical output window assembly 162 (see FIG. 1b). Cathode assembly 118 and anode assembly 120, defining discharge region 122, extend parallel to one another along the length of laser chamber 100.

Recirculation of lasing gas 108 is provided by a tangential fan 140, which rotates about an axis 142 and includes a plurality of substantially parallel straight blade members 144 extending along the length of laser chamber 100 between hub members 146. A typical rotation rate for current tangential fans is on the order of approximately 3800 revolutions per minute (rpm). As shown by arrows in FIG. 1a, the flow of gas 108 is upward through tangential fan 140 and transversely across discharge region 122 as directed by a vane member 152. Lasing gas 108 that has flowed through discharge region 122 becomes dissociated and heated considerably by the pulsed gas discharge. A gas-to-liquid heat exchanger 158 (not shown in FIG. 1b) extending along the length of laser chamber 100 is positioned in the gas recirculation path to cool the heated gas. Other vane members, e.g. vane members 160, direct the flow of gas 108 through heat exchanger 158 and elsewhere along the gas recirculation path. Recirculation cools and recombines lasing gas 108, thereby allowing repetitively pulsed laser operation without replacing lasing gas 108.

There are a variety of current issues relating to laser chamber 100 and its associated components, including, among other things, those described below.

The present tangential fan is difficult and expensive to fabricate. Blade members 144 and hub members 146 are individually stamped and formed from aluminum or another suitable alloy, such as an aluminum/bronze alloy, then dip brazed together to form tangential fan assembly 140, using a braze material typically containing approximately 13 per cent silicon by weight. This is a tedious and labor-intensive process. Because the brazed fan assembly has poor mechanical rigidity, post-machining can cause damage and warpage and is thus difficult or impractical. Therefore it is difficult to achieve precision alignment and critical tolerances. The brazed tangential fan assembly 140 is typically coated with electroless nickel.

Since lasing gas 108 is recirculated and reused, it is important to maintain cleanliness and to prevent contamination of the gas environment within laser chamber interior 105, in order to maximize the pulse energy performance, stability, and working life of lasing gas 108.

Undesirable vibrations in the rotating fan assembly adversely affect bearing life. Reduction of these vibrations will reduce bearing wear and allow the possibility of increasing the fan rotation speed for increased gas flow velocity. Particularly, adverse vibrations are associated with the low present natural vibrational frequency of the rotor-dynamic assembly, including the fan, bearings, shafts, and magnetic rotor. This low natural frequency is largely attributable to low first and subsequent bending mode frequencies of the fan, due to poor mechanical stiffness.

An aerodynamic buffeting effect has been observed, which, among other things, transmits vibrations to the fan bearings, causing bearing wear and premature failure. Measurements of the frequency of these vibrations suggest that they are caused by gas pressure fluctuations generated each time a fan blade member 144 passes in close proximity to the edge of anode assembly 120. Of importance, the clearance between fan blade members 144 and the proximate edge of anode assembly 120 is particularly close, in order to minimize reverse flow leakage and maximize gas flow efficiency. Previous attempts to reduce aerodynamic buffeting by reshaping the anode assembly have resulted in an undesirable reduction in gas flow velocity by approximately ten or more per cent.

Many applications require a substantially constant laser pulse output energy. However, strong and undesirable fluctuations in pulse output energy have been observed. These fluctuations have been found to be particularly severe at high laser pulse repetition rates.

Accordingly, it would be desirable to fabricate a tangential fan assembly economically, such that the finished fan assembly has improved mechanical rigidity against vibrations. Additionally, it would be desirable to minimize or eliminate potential contaminants from the laser chamber. Further, it would be desirable to minimize or eliminate vibrations arising from aerodynamic buffeting, and to minimize or eliminate pulse output energy fluctuations in a TE pulsed gas laser, particularly at high laser pulse repetition rates.

SUMMARY

A gas laser apparatus includes a tangential fan and cutoff assembly, configured to recirculate a lasing gas mixture. Generally, in accordance with the invention, a blade member of the fan varies in circumferential position between a first end flange and a second end flange. In some embodiments, this variation in circumferential position is accomplished in a stepwise offset fashion, with the tangential fan partitioned longitudinally into sections. In some embodiments, an equivalent effect is achieved by tapering the edge of the anode or cutoff assembly.

In some configurations, circumferentially adjacent blade members are spaced evenly circumferentially relative to one another. Some versions have an odd integral number of blade members around the circumference. In some versions the circumferential number of blade members is constant longitudinally between the end flanges, whereas in other versions the circumferential number of blade members is variable between the end flanges. In some configurations, the circumferential position of blade members varies monotonically between the two end flanges. In other configurations, the variation in circumferential position reverses direction circumferentially one or more times between the two end flanges.

The tangential fan can operate in the chamber of a transverse-excited excimer laser, more particularly a krypton fluoride or argon fluoride excimer laser, or of a fluorine ($F_2$) molecular gas laser.

Blade members extend longitudinally between and adjacent to the outside circumference of the end flanges. Typically, the blade members are stiffened by one or more transverse substantially annular hub members, parallel with and spaced between the end flanges. In particular, a tangential fan according to embodiments of the invention is stiffened by optimizing the number and placement of annular hub members, thereby controlling the natural frequency of the bending vibrational mode of the fan. This reduces fan vibration without substantially changing any other fan performance characteristic.

A tangential fan in accordance with the invention can be made using a conventional method of brazing together individually stamped and formed blade members and hub members. The invention provides improved methods of forming a tangential fan, involving forming monolithic fan structures by casting, or by machining out of a solid block of material. The tangential fans formed have superior mechanical rigidity, more accurate tolerances, and lower contaminant concentrations than conventionally made tangential fans. The methods provided by the invention are also applicable to tangential fans having conventional geometry.

The monolithic structures formed in accordance with some embodiments include integral hub and blade members. In some embodiments, two or more such monolithic structures are joined together, typically by electron-beam welding. In the casting, welding, and machining process no additional materials are introduced that might cause contamination, when installed in the laser chamber. The methods provided by the invention facilitate forming of blade members into an air foil shape. In some embodiments, the inside diameter of the hub members is machined flush with the inside diameter defined by the plurality of blade members.

Casting can be performed by die casting or investment casting. In some embodiments, an aluminum casting alloy containing additive metals consisting substantially of 3.5–6.5 per cent copper and 0–2.5 per cent nickel or 0–1.5 per cent silver is used. For machined monolithic structures, 6061 aluminum alloy is typically used. Finishing processes typically include post-machining, electropolishing, and electroless nickel coating.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent to those skilled in the art by referencing the accompanying drawings. For simplicity and ease of understanding, common numbering of elements within the illustrations is employed where an element is the same in different drawings.

FIG. 3c is a schematic cross-sectional view of an airfoil blade member viewed along direction C—C of FIG. 3a;

FIG. 4f is a cross-sectional detail view of machined tangential fan structure taken along direction F—F of FIG. 4a.

DETAILED DESCRIPTION OF THE EMBODIMENTS

The following is a detailed description of illustrative embodiments of the present invention. As these embodiments of the present invention are described with reference to the aforementioned drawings, various modifications or adaptations of the methods and or specific structures described may become apparent. These descriptions and drawings are not to be considered in a limiting sense as it is understood that the present invention is in no way limited to the embodiments illustrated.

Figure 1A:
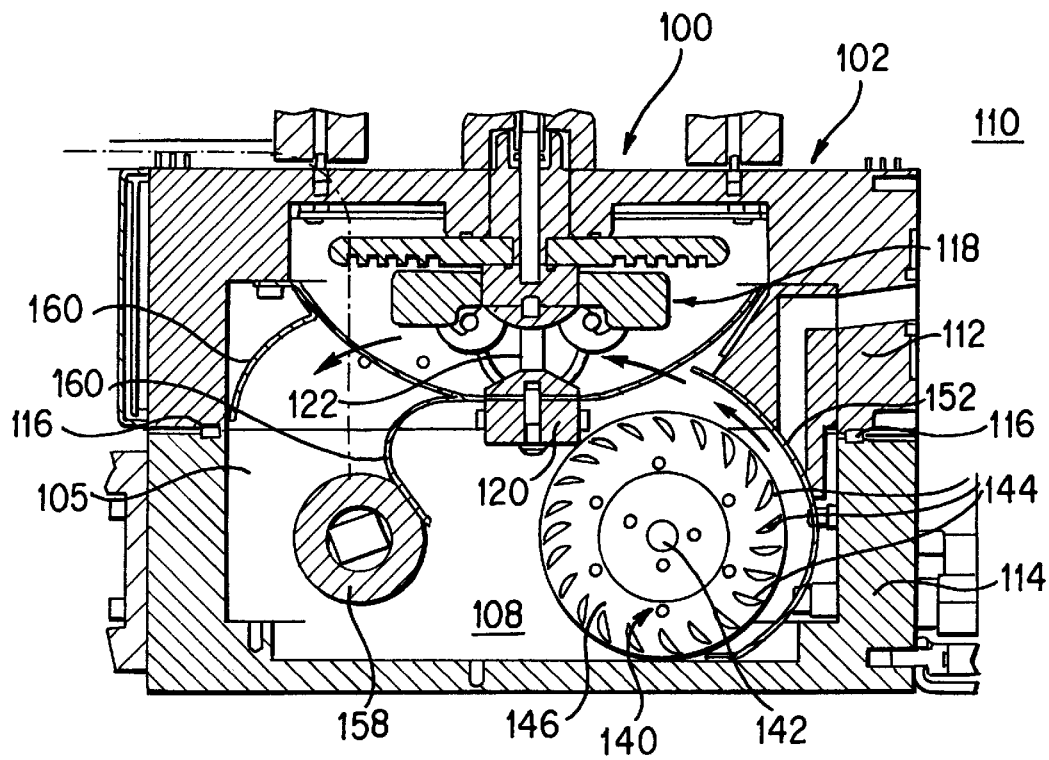
FIGS. 1a and 1b are cross-sectional end and side views respectively showing the inner structure of a laser chamber in a conventional TE excimer laser.
Figure 1B:
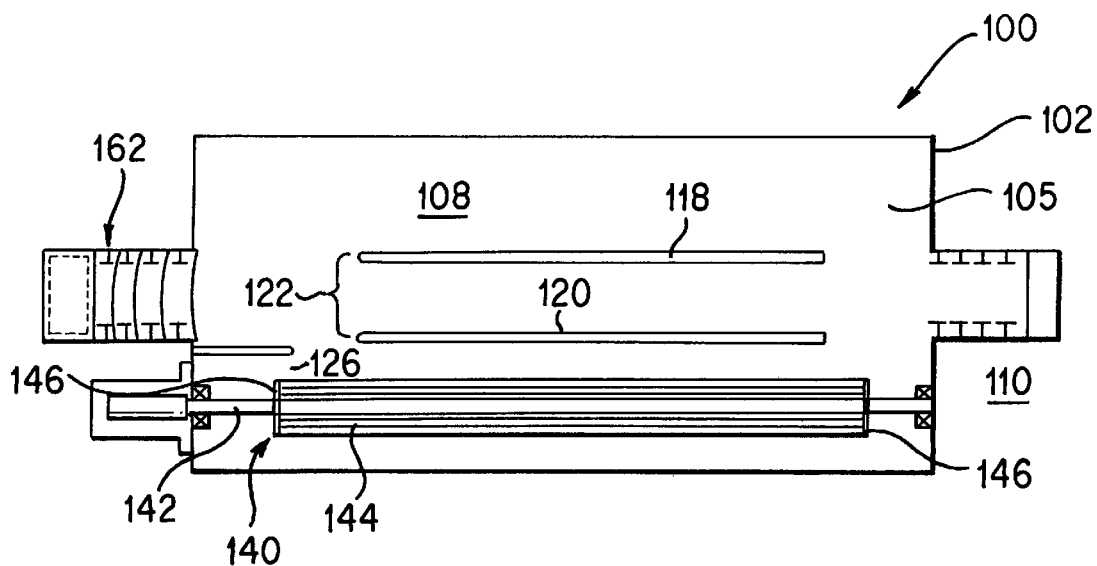

Referring to FIGS. 1a and 1b, undesired fluctuations in laser pulse output energy have been found to originate from shock energy reflected off rotating blade members 144 of tangential fan 140. T. Hofmann et al., "Origin of Energy Fluctuations at High Repetition Rate," CYMER INC. Technical Memo, Mar. 31, 1997, recites, among other things: "The blower interacts with the way shock waves from the discharge can re-enter the discharge region. This can be done either by direct reflection off the fan blades or by creating an angle-dependent transmission for shock waves traveling through the fan. A modulation with the blower speed only occurs for PRFs where the time of flight coincides with a certain shock wave path. In any case, for PRFs below 2.5 kHz and the given chamber geometry it is obvious that shock waves undergo multiple reflections before re-entering the discharge." As used in the above quotation "PRF" is the standard abbreviation for "Pulse Repetition Frequency."

Pulsed gas discharges in discharge region 122 generate acoustic shock waves in lasing gas 108, which propagate from discharge region 122 through lasing gas 108 and are reflected from solid surfaces, e.g., heat exchanger 158 and inner walls of enclosure 102, inside laser chamber 100. A portion of the reflected shock energy reenters discharge region 122, where it interacts with the electrical and optical properties of lasing gas 108. This reflected shock energy interaction can increase or decrease the pulse output energy of the laser.

Some reflecting surfaces, e.g., chamber walls, are stationary, whereas surfaces of tangential fan 140 are rotating with a substantially regular rotational period. Changes in laser pulse output energy due to shock energy reflected from stationary surfaces are relatively uniform and tolerable, whereas pulse output energy changes due to shock energy reflected from rotating fan surfaces exhibit fluctuations.

Attempts to date to overcome this problem have met with limited success. Redesigning vane members 152, 160 in laser chamber 100 only partially reduces pulse output energy fluctuations. Applying acoustic damping material to surfaces within laser chamber 100 introduces porosity, which provides a source of contamination and also extends the passivation time during processing of laser chamber 100.

The structure of conventional tangential fan 140 incorporating straight parallel blade members 144 has cylindrical symmetry. This traditional cylindrical symmetry promotes periodic reflection of shock energy, which is reinforced in phase along the entire length of tangential fan 140. The present invention provides for a tangential fan structure that breaks the traditional cylindrical symmetry and minimizes reinforced in-phase periodic reflection of shock energy, allowing a more uniform laser pulse output energy.

Figure 2A:
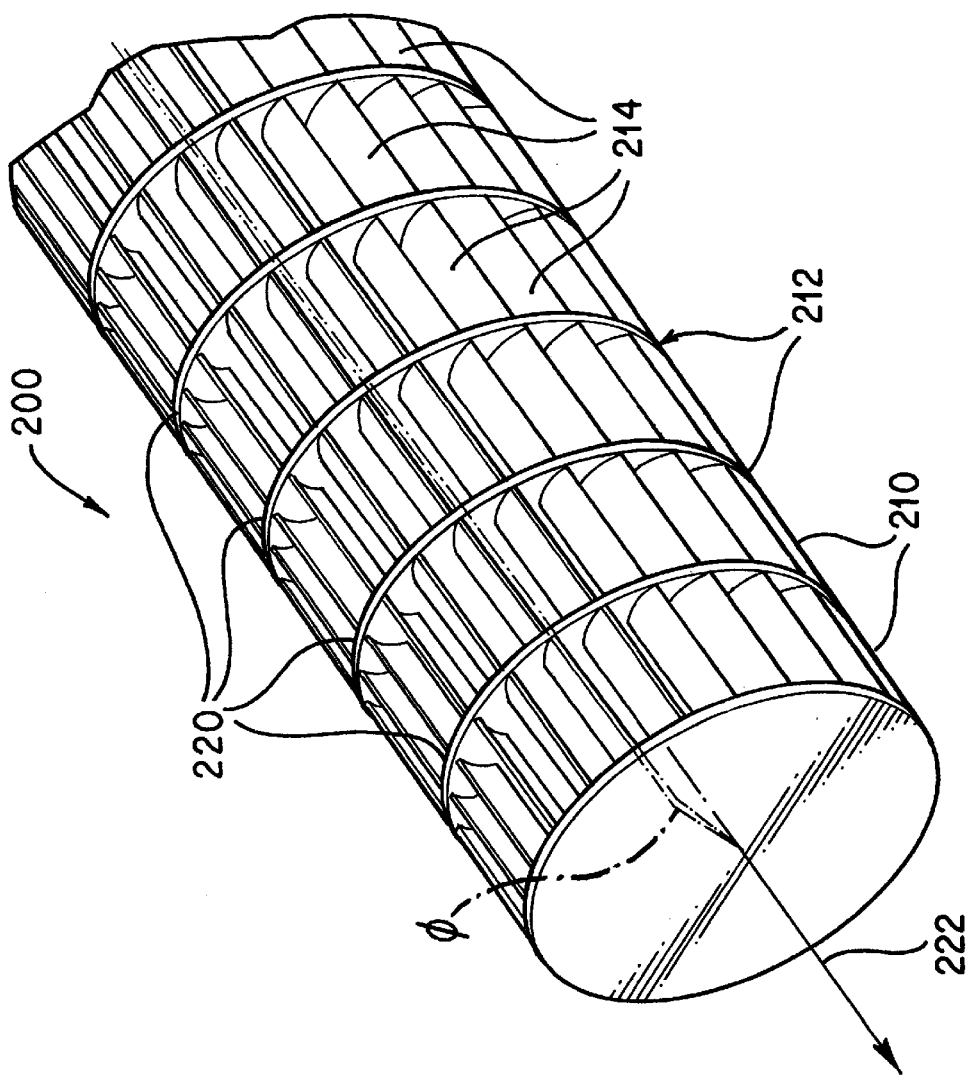
FIG. 2a is an isometric view of a portion of a tangential fan without cylindrical symmetry, in accordance with an embodiment of the present invention.

FIG. 2a is an isometric view of a portion of a tangential fan 200 without cylindrical symmetry, in accordance with an embodiment of the present invention. Tangential fan 200 is partitioned longitudinally into a plurality of sections 210 each containing blade members 214 spaced substantially evenly about the circumferences 220 of hub members 212. Blade members 214 of all sections 210 are aligned longitudinally parallel with a longitudinal rotation axis 222 of tangential fan 200 concentric with circumferences 220. However, blade members 214 of a section 210 are offset by a circumferential angle φ relative to blade members 214 of adjacent sections 210. This configuration breaks the traditional cylindrical symmetry and minimizes in-phase reflection of shock energy that causes laser pulse output energy fluctuations.

For example, tangential fan 200 as shown in FIG. 2a is partitioned into 18 longitudinal sections 210 (shown only in part for clarity). Each section 210 includes 23 blade members evenly spaced about circumference 220. A number of different circumferential offset schemes can be used. In accordance with one such scheme, circumferential offset angle φ between adjacent sections 210 is equal to $\frac{1}{18}$ of a full circumferential revolution of 360 degrees, such that a full 360-degree circumferential revolution of the blade pattern is evenly distributed among the 18 sections 210. According to another such scheme, a circumferential offset angle φ of $\frac{1}{18}$ times $\frac{1}{23}$ of a full circumferential revolution is applied between adjacent sections 210, thereby evenly distributing a cumulative circumferential offset of one blade position among the 18 sections 210. According to other such schemes, the circumferential offset angle φ between blade positions of adjacent sections 210 can be an integral multiple of $\frac{1}{18}$ or of $\frac{1}{18}$ times $\frac{1}{23}$ of a full circumferential revolution.

Figure 2B:
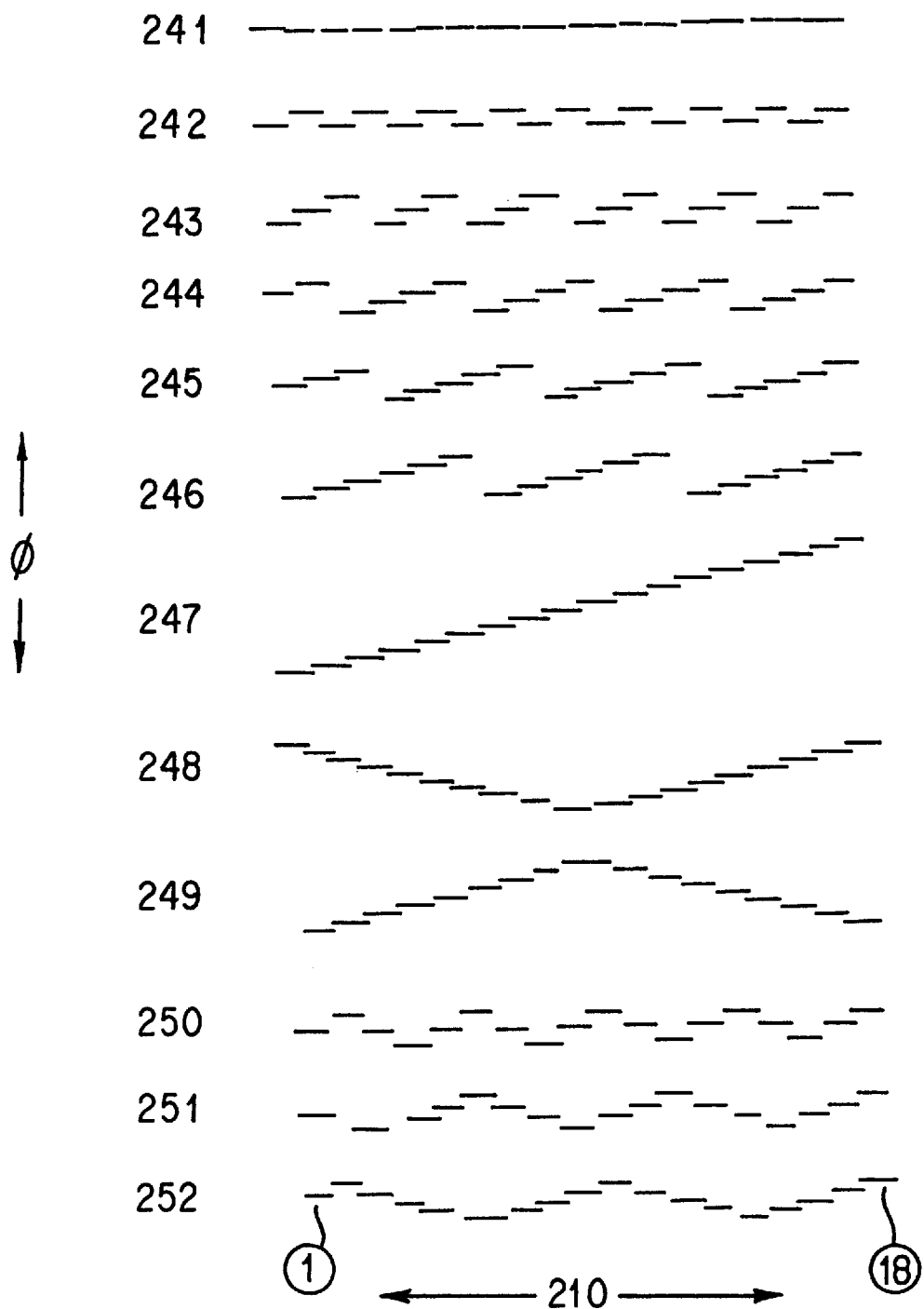
FIG. 2b is a graphical representation of the dependence of circumferential offset angle on sections of a tangential fan, in accordance with an embodiment of the present invention.

In some configurations, circumferential offset angle φ between adjacent sections 210 shifts in a constant circumferential direction from end to end of tangential fan 200. In other configurations, circumferential offset angle φ between adjacent sections 210 reverses direction one or more places in progressing from end to end of tangential fan 200. FIG. 2b is a graphical representation of different examples 241–252 of the dependence of circumferential offset angle φ on section 210 of tangential fan 200 having 18 sections 210. Sections 210 of tangential fan 200 are displayed sequentially along the horizontal direction. Circumferential offset angles φ are shown by the vertical positions of horizontal line segments. Example 241 illustrates a conventional tangential fan configuration having no offset of blade patterns between sections. Example 247 illustrates a constant circumferential shift direction. Other examples, 242–246 and 248–252, illustrate varying circumferential shift configurations.

Of importance, circumferential offset angle φ should not be an integral multiple of the circumferential spacing between adjacent blade members 214 within a section 210. Such a circumferential offset angle φ would result in a replication of the original blade pattern orientation, and thus would not break the traditional cylindrical symmetry. Although the previous examples describe an equal number of blade members 214 per section 210, the number of blade members in a section can vary from section to section.

Referring to FIG. 2a, tangential fan 200 breaks the traditional cylindrical symmetry by circumferentially offsetting the circumferential orientations of blade members 214 at differing longitudinal positions along the length of tangential fan 200. When tangential fan 200 is installed in laser chamber 100 (see FIGS. 1a–1b), such circumferential offsets provide a differing reflection angle of shock energy for each differing blade member orientation. The tangential fan configurations described in connection with FIG. 2a replace each traditionally straight continuous blade member 144 of tangential fan 140 (see FIGS. 1a–1b) with a plurality of parallel but offset blade members 214 having a distribution of differing circumferential orientations. In the examples described above, the reflection of shock energy at a particular angle by any individual blade member 214 of tangential fan 200 is approximately 18 times smaller than the reflection of shock energy at that same angle by a longer individual blade member 144 of conventional tangential fan 140. As a result, a substantially smooth temporal distribution of reflected shock energy reenters discharge region 122 (see FIGS. 1a–1b) as tangential fan 200 rotates, greatly reducing laser pulse output energy fluctuations.

Additionally, the circumferential offset of blade members reduces the aerodynamic buffeting effect described in connection with FIGS. 1a–1b. Since each straight continuous blade member 144 of conventional tangential fan 140 is replaced by a circumferentially offset distribution of shorter blade members 214 of tangential fan 200, only a much smaller blade member 214 passes in close proximity to the edge of anode assembly 120 at a given time. Accordingly, each time such a smaller blade member 214 passes the edge of anode assembly 120, a correspondingly smaller gas pressure fluctuation is generated. This in turn reduces the buffeting vibration amplitude transmitted to the tangential fan bearings.

For example, if each blade member 214 extends only 1/18 of the length of tangential fan 200, then it generates only approximately 1/18 of the gas pressure fluctuation of a full-length blade member 144 of conventional tangential fan 140. This reduced gas pressure fluctuation in turn transmits to the tangential fan bearings only approximately 1/18 of the vibration amplitude transmitted with conventional tangential fan 140.

Figure 2C:
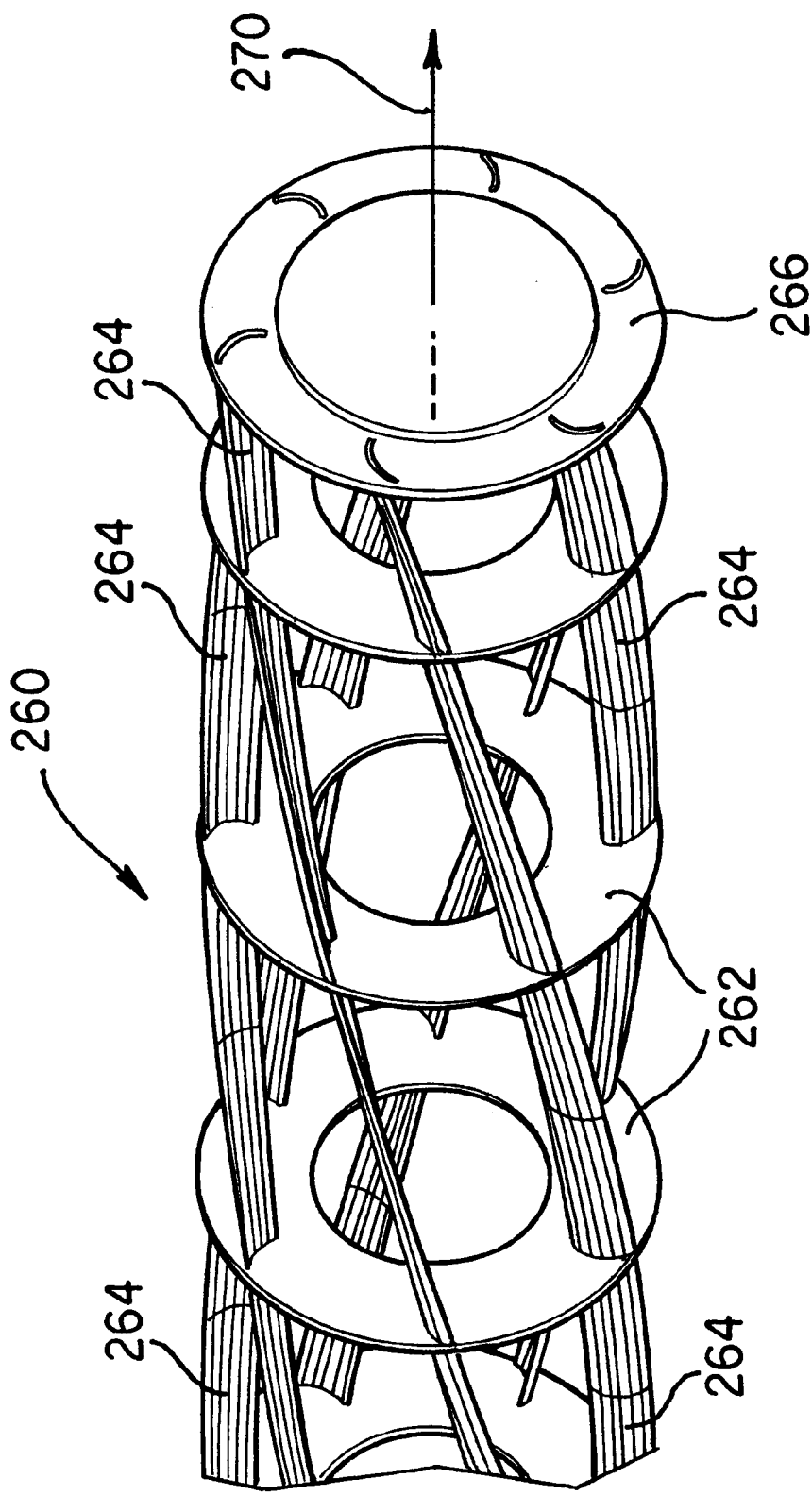
FIG. 2c is an isometric view of a skewed or twisted substantially helical blade fan structure, in accordance with an embodiment of the present invention.

FIG. 2c is a schematic view of a skewed or twisted substantially helical blade fan structure 260. Tangential fans with skewed or twisted blade geometry are commercially available, e.g., from Hi-Tech Blowers, Inc., of 525 Northern Blvd., Great Neck N.Y. 11021. Twisted blade fan structure 260 is effectively the continuous limit of tangential fan 200, wherein each blade member 264 is partitioned into an infinite number of infinitesimally short sections, having continuous substantially helical relative offset about a rotation axis 270 rather than a stepped circumferential relative offset. Twisted blade fan structure 260 can include full-length blade members 264 as shown in FIG. 2c, having either a clockwise or counterclockwise helical twist. Alternatively, twisted blade fan structure 260 can include multiple longitudinal sections of blade members 264 having alternately reversed adjacent clockwise and counterclockwise substantially helical twists, to cancel longitudinal aerodynamic effects. Twisted blade fan structure 260 typically includes hub members 262 to support and stiffen blade members 264. Twisted blade fan structure 260 also includes end flanges 266 to provide attachment to rotating end shafts (described below in connection with FIGS. 4a–4e).

Relative to tangential fan 200, twisted blade fan structure 260 provides equal or greater reduction of laser pulse output energy fluctuations and of vibrations due to aerodynamic buffeting. However, twisted blade fan structure 260 is considered to be more difficult to fabricate than is tangential fan 200.

A further configuration for reducing pulse output fluctuations and aerodynamic buffeting is a tilted tangential fan axis (not shown) within laser chamber 100. Tangential fan rotation axis 142 (see FIGS. 1a–1b) is tilted relative to the longitudinal axis of discharge region 122 and anode assembly 120. Vane members 152, 160 and anode assembly 120 are appropriately reconfigured. Performance benefits are expected from such a tilted axis fan configuration. However, accommodating a tilted axis fan into a laser chamber 100 and making required structural modifications is judged to be impractically complex and expensive. Alternatively, a tangential fan having a variable or tapered circumference can be employed. However, such a tangential fan would necessitate substantial structural modifications to the laser chamber.

Figures 2D, 2E:
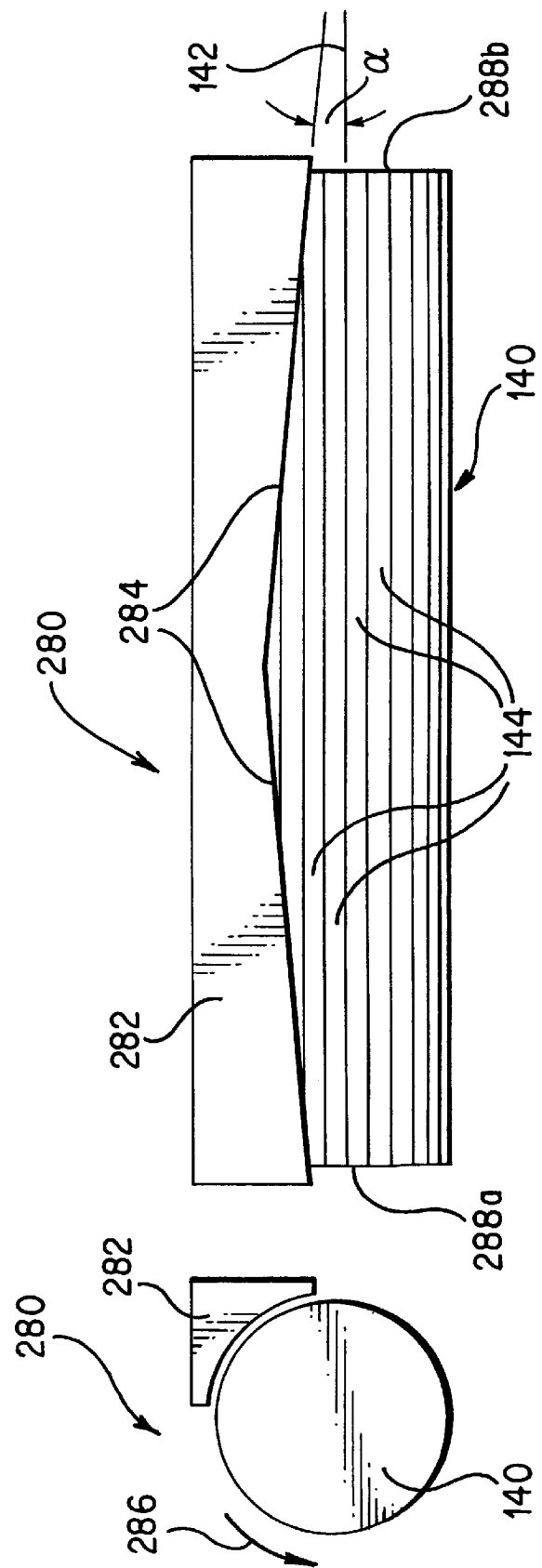
FIGS. 2d and 2e are schematic end and front views respectively of a tangential fan with anode assembly having a tapered anode support bar or cutoff.

Similarly, reconfiguring the anode assembly and/or vane members alone can achieve successful reduction in pulse output fluctuations and aerodynamic buffeting. FIGS. 2d and 2e are schematic end and front views respectively of a tangential fan and anode assembly 280 having a stationary tapered anode support bar or cutoff 282. The diagonal edges 284 of cutoff 282 are located in close proximity to the outer circumference of blade members 144 of tangential fan 140, which rotates about rotation axis 142. Tapered edges 284 are oriented diagonally relative to rotation axis 142.

As tangential fan 140 rotates in a direction indicated by an arrow 286, blade member 144 passes gradually into close proximity to diagonal edge 284 of cutoff 282. As illustrated in FIGS. 2d–2e, the portions of blade member 144 nearest the ends 288a, 288b of tangential fan 140 rotate first into close proximity with diagonal edges 284. Eventually the portions of blade member 144 midway between ends 288a, 288b rotate into close proximity with diagonal edges 284. This configuration effectively breaks the cylindrical symmetry of the conventional tangential fan and cutoff assembly illustrated in FIG. 1a, 1b. For example, tapered cutoff 282 in combination with straight longitudinal blade members 144 of conventional tangential fan structure 140, provides a reduction in aerodynamic buffeting equivalent to that of a straight conventional cutoff or anode assembly 120 in combination with tangential fan structure 200 or 260, having respectively staggered or twisted blade members.

Alternatively, a tapered cutoff is configured such that portions of blade member 144 midway between ends 288a, 288b rotate first and portions of blade member 144 nearest ends 288a, 288b rotate last into close proximity with the diagonal edges of the cutoff. In another alternative configuration, a tapered cutoff has an edge oriented substantially in a single direction, such that portions of blade member 144 nearest one end, e.g., 288a, rotate first and portions of blade member 144 nearest the opposite end, e.g., 288b, rotate last into close proximity with the diagonal edge of the cutoff.

Blade members 144, as illustrated in FIGS. 2d and 2e, are aligned substantially parallel to rotation axis 142. However, blade members 144 need not be aligned precisely parallel to the rotation axis 142, but can also be oriented on a slight diagonal relative to rotation axis 142, so as to be substantially parallel.

The above-described tangential fan configurations 200 and 260 can be fabricated as brazed assemblies of individually stamped and formed blade and hub members, similar to conventional tangential fan 140, as described above in connection with FIGS. 1a–1b.

Alternatively, tangential fan configurations 200, 260 can be fabricated as monolithic castings, which are then post-machined on their end flanges 266 (see FIG. 2c) inside and outside diameters, and then electroless nickel coated. A conventional die casting or investment casting process can be employed (see for example "Metal Quality Standards," Investment Casting Institute, 8350 N. Central Expressway #M1110, Dallas, Tex. 75206–1602, 1987), using an aluminum or aluminum-bronze casting alloy. Suitable aluminum alloys include low-silicon alloys containing 3.5–6.5 per cent copper, 0–2.5 per cent nickel or 0–1.5 per cent silver, and lesser concentrations of magnesium, titanium, iron, manganese, and various trace metals.

Figure 3A:
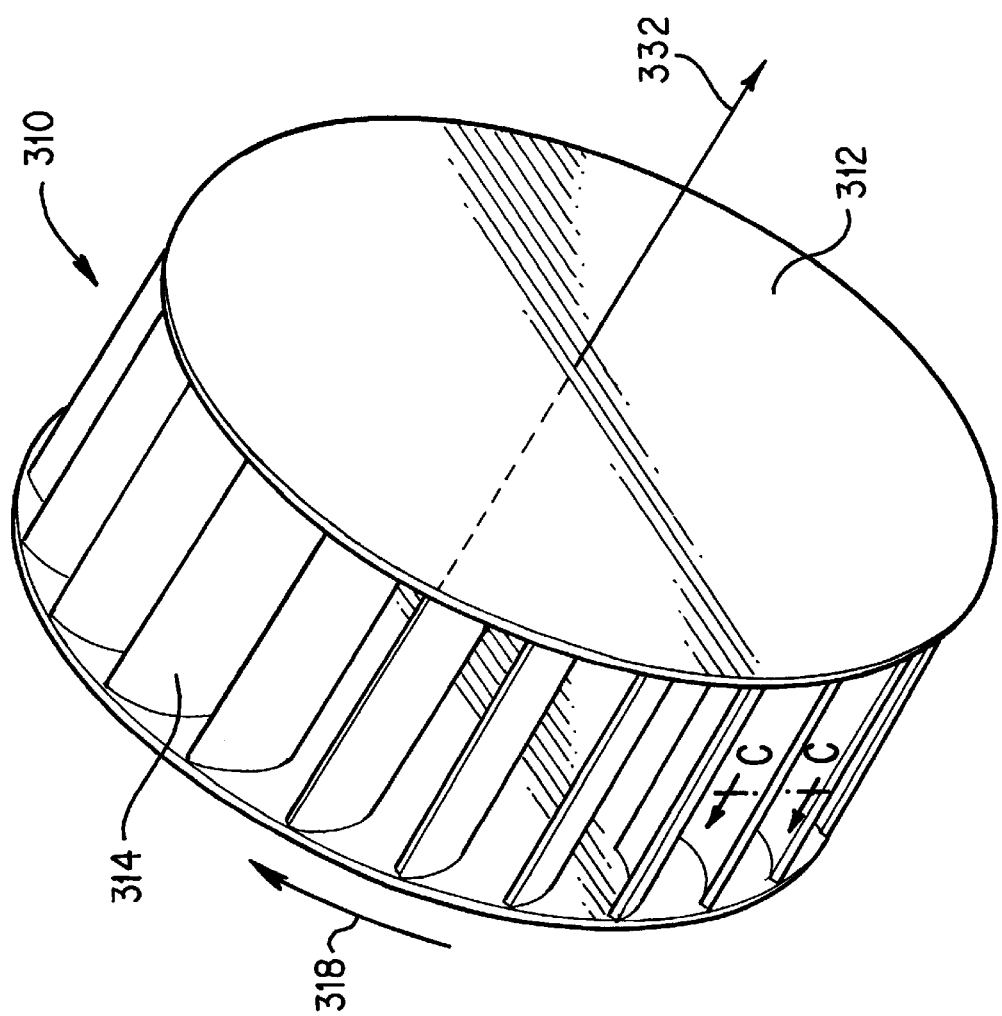
FIG. 3a is an isometric view of a cast section of a tangential fan assembly, in accordance with one embodiment of the present invention.

A tangential fan assembly can also be cast in sections, which are then joined together longitudinally. FIG. 3a is an isometric view of a cast section 310 of a tangential fan assembly, in an embodiment of the present invention. Cast section 310 includes integrally cast hub 312 and blade 314 members. An arrow designated by reference numeral 318 shows the direction of fan rotation about an axis 332 relative to the curvature of blade members 314. Conventional die casting or investment casting is performed using an aluminum or aluminum-bronze casting alloy, as described above in connection with FIGS. 2a and 2c, in order to meet required precise dimensional and alignment tolerances, as described below in connection with FIGS. 4a–4e.

Figure 3B:
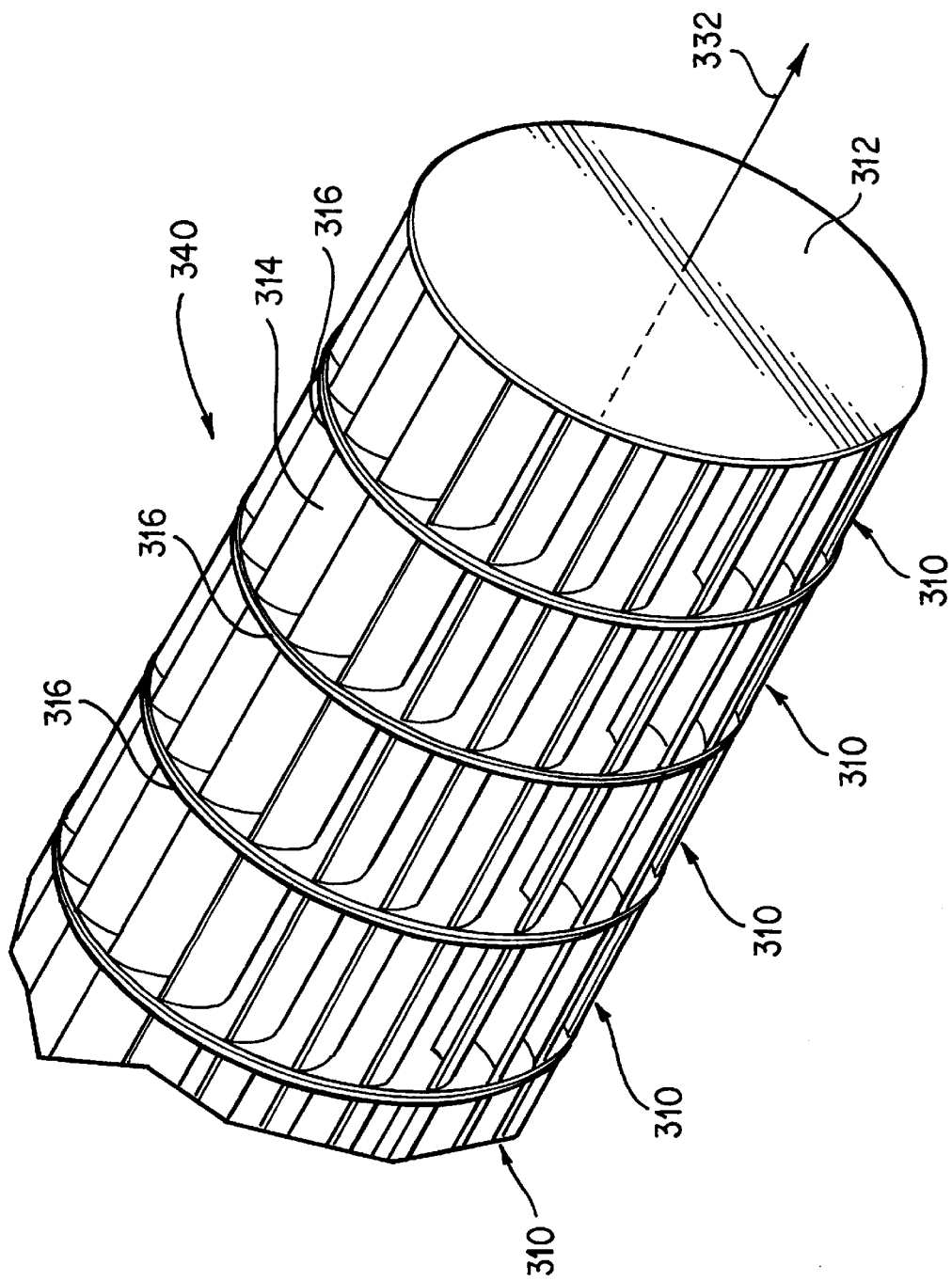
FIG. 3b is an isometric view of a portion of a tangential fan assembly including a plurality of sections joined together longitudinally, in accordance with one embodiment of the present invention.

FIG. 3b is an isometric view of a portion of a tangential fan structure 340, including a plurality of sections 310 joined together longitudinally along a common axis 332. Typically, electron beam (EB) welding is employed for joining sections 310. The cast sections 310 are precisely post-machined on their inside diameters, outside diameters, and on the end surfaces of hub members that mate with adjacent sections 310 to which they will be joined. Sections 310 plus two end flanges, such as end flange 266 (see FIG. 2c) are then secured to a mandrel or other appropriate fixturing, to provide a mechanically straight and balanced welded tangential fan assembly, and are EB welded around the entire outside diameter 316 between all mating sections 310 and end flanges. The welded final assembly is post-machined to achieve desired final dimensions and tolerances, as described below in connection with FIGS. 4a–4e, and is then electroless nickel coated for corrosion resistance. For simplicity, blade members 314 of tangential fan structure 340 are shown as longitudinally straight and aligned parallel between sections 310. In some embodiments, blade members 314 of tangential fan structure 340 are twisted, as shown in FIG. 2c, and/or are offset circumferentially from section to section, as shown in FIG. 2a. Such an offset can be achieved by rotating sections 310 relative to one another about rotation axis 332 prior to welding.

Figure 4A:
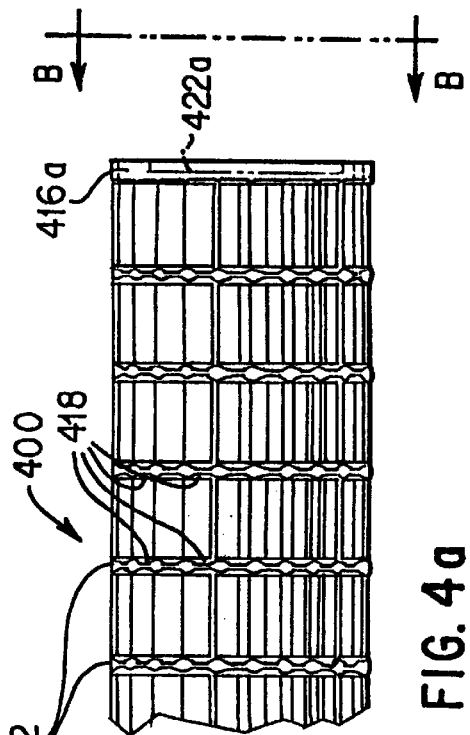
FIGS. 4a and 4b are respectively longitudinal and end views of a monolithic tangential fan structure machined from a single block of 6061 aluminum alloy, in accordance with an embodiment of the present invention.
Figure 4B:
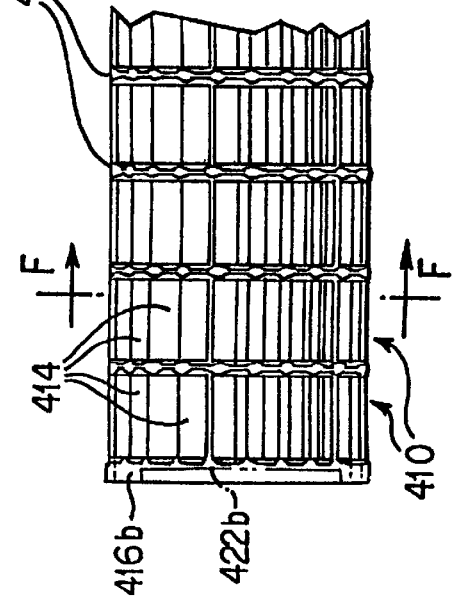

A further method of fabricating a tangential fan assembly involves machining an entire fan assembly as a monolithic unit from a single block of material. FIGS. 4a and 4b are respectively longitudinal and end views of a monolithic tangential fan structure 400 machined from a single block of 6061 aluminum alloy, in accordance with an embodiment of the present invention. Machined tangential fan structure 400 is partitioned into sections 410 between consecutive integral substantially annular hub members 412 and two integral substantially annular end flanges 416a and 416b disposed substantially concentrically about a rotation axis 440. Integral blade members 414 extend longitudinally across each section 410 between consecutive hub members 412 and/or end flanges 416a and 416b. For simplicity, blade members 414 of machined tangential fan structure 400 are shown as longitudinally straight and aligned parallel to rotation axis 440 between sections 410. In some embodiments, blade members 414 of tangential fan structure 400 are twisted, as shown in FIG. 2c, and/or are offset circumferentially from section to section, as shown in FIG. 2a.

Figure 4C:
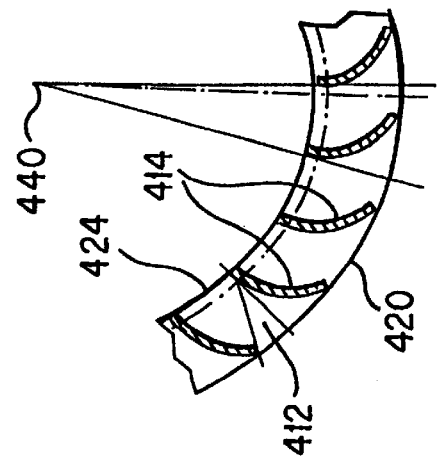
FIG. 4c is a detail view showing fillets connecting blade members with a hub member of a monolithic machined tangential fan structure.

Hub members 412 provide structural rigidity to blade members 414 and thereby to machined tangential fan structure 400. Particularly, tangential fan structure 400 is machined such that stiffening fillets 418 are formed in the corners connecting the ends of blade members 414 and the annular surfaces of hub members 412 and end flanges 416a, 416b. FIG. 4c is an isometric detail view showing fillets 418 having radii of, e.g. 2.54 mm, connecting blade members 414 with a hub member 412.

The outside diameter 420 of tangential fan structure 400 is typically machined within a tolerance of ±0.13 mm. Counterbores 422a and 422b machined in respective end flanges 416a, 416b are flat and parallel relative to one another within typically ±0.013 mm, and are concentric with an inside diameter 424 within ±0.051 mm. Bolt holes 426 are drilled in end flanges 416a, 416b, for example equally spaced eight places on a bolt circle 428, for attaching rotating shaft assemblies (shown below in FIGS. 4d–4e). An extra clocking hole 430 is provided on bolt circle 428 to accommodate a pin (not shown) that restricts the drive shaft assembly to one end only of tangential fan structure 400. Dimensions and tolerances applying to machined tangential fan structure 400 can apply as well to all other tangential fan structures 200, 260, 340 using any of the methods of fabrication described above.

Figure 4F:
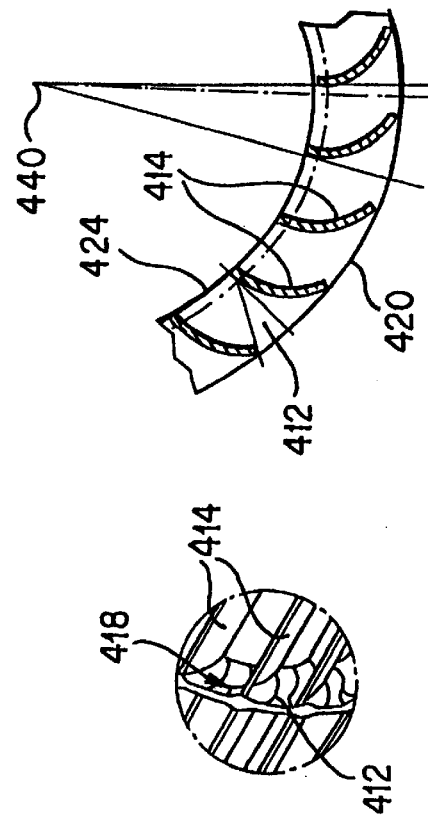
Figure 4E:
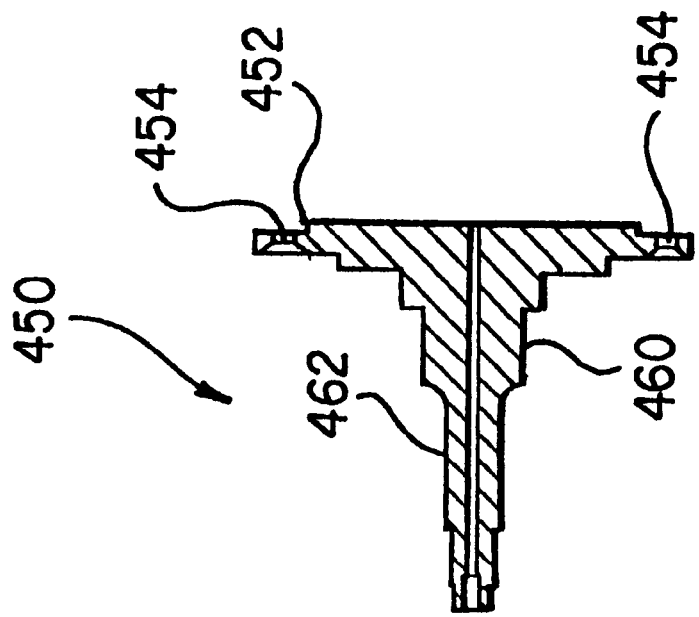
FIGS. 4d and 4e are an end view and a cross-sectional side view, respectively, of a rotating shaft assembly configured to attach to a tangential fan structure, in accordance with some embodiments.
Figure 4D:
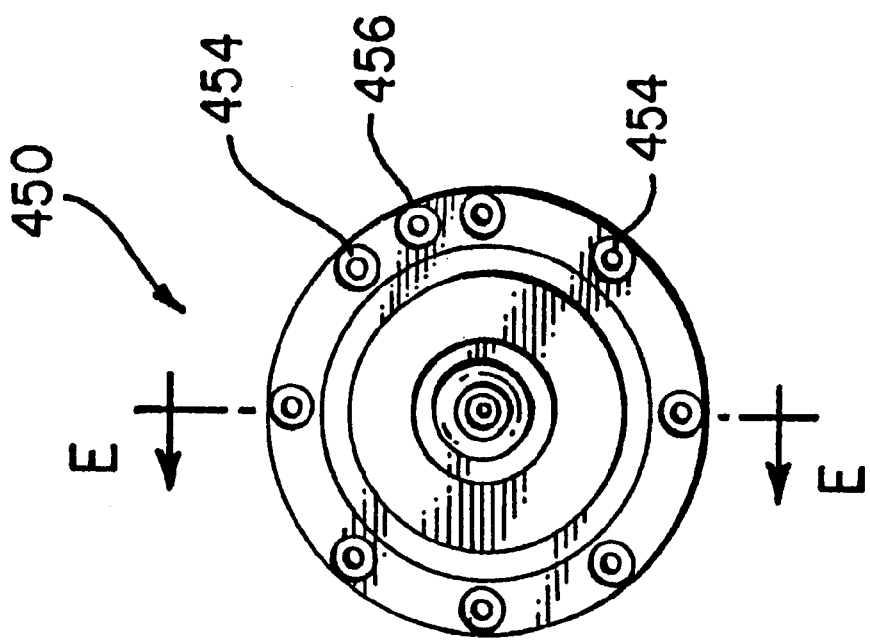

FIGS. 4d and 4e are an end view and a crosssectional side view, respectively, of a rotating shaft assembly 450 configured to attach to tangential fan structure 400, in accordance with some embodiments. In other embodiments, a rotating shaft assembly similar to rotating shaft assembly 450 can attach to tangential fan structures such as tangential structures 140, 200, 260, and 340. A circular shoulder 452 fits concentrically into counterbore 422a, 422b to locate rotating shaft assembly 450 accurately relative to tangential fan assembly 400. Bolt holes 454 on a concentric bolt circle contain bolts (not shown) to secure rotating shaft assembly 450 to end flange 416a, 416b of tangential fan assembly 400. An extra clocking hole 456 is included to differentiate the drive side from the idle side of tangential fan assembly 400. An outer shaft diameter 460 is tapered stepwise to a concentric bearing shaft 462, configured to rotate within a shaft bearing (not shown).

The machined tangential fan structure 400 is electropolished to achieve a surface finish of the order of 0.4 μm to 0.6 μm (15 microinch to 25 microinch) Ra on all surfaces, and is then electroless nickel coated.

Figure 3C:
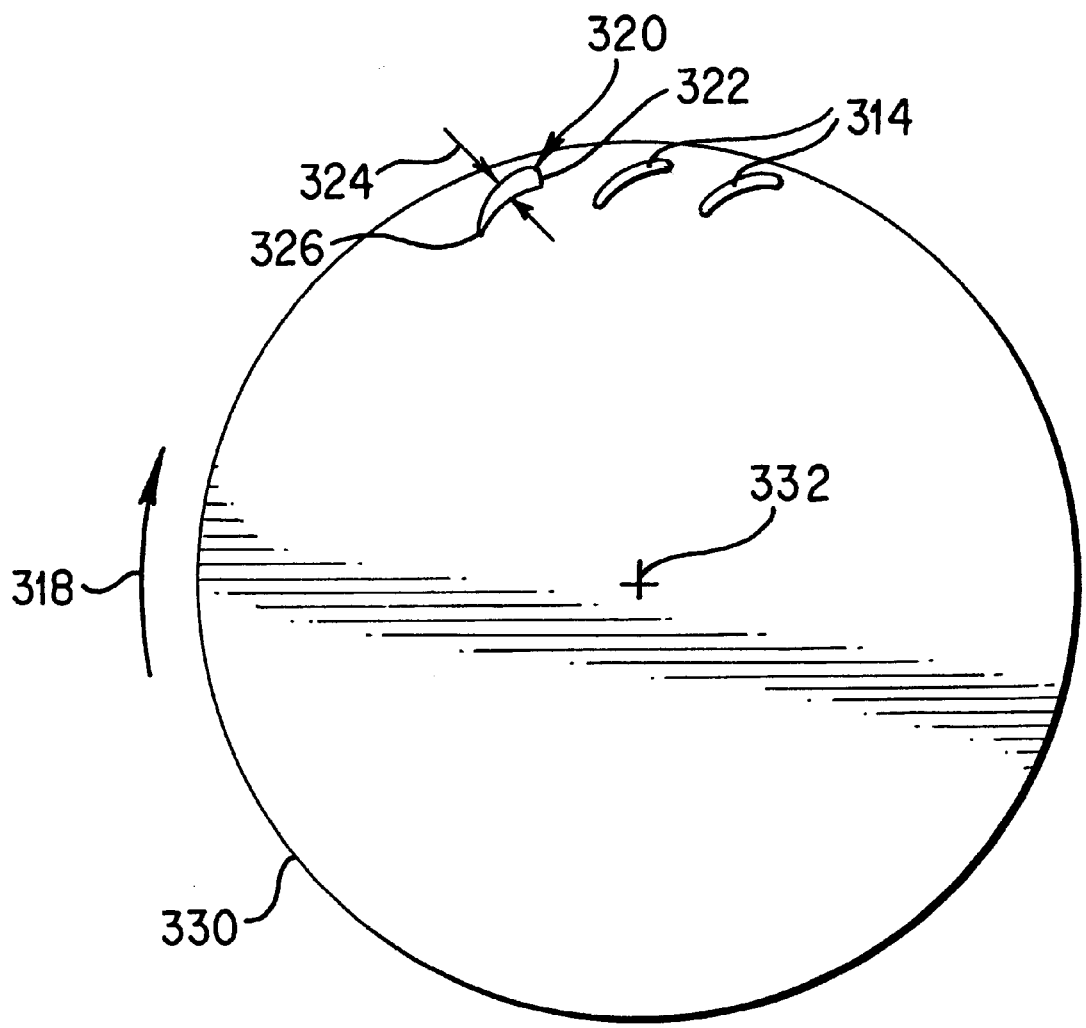

Monolithic machined, cast, or cast-and-welded tangential fans, such as those described above in connection with FIGS. 2a–2c, 3b, and 4a–4b also allow the shaping of airfoil blade members, which are difficult or impractical to produce using conventional stamping processes. For example, FIG. 3c is a schematic cross-sectional view of an airfoil blade member 320 viewed along direction C—C of FIG. 3a. Airfoil blade member 320 is shown superimposed in cross-section on a circumference 330 of a tangential fan structure, e.g., tangential fan structures 200, 260, 340, 400. Conventional blade members 314 are shown in cross-section for comparison. For clarity, only one airfoil blade member 320 and two conventional blade members 314 are shown. An arrow designated with reference number 318 indicates the rotation direction of the tangential fan about axis 332 relative to the curvature of the blade members. Whereas conventional blade members 314 are substantially uniform in thickness, airfoil blade member 320 typically has a "tear-drop" profile, including a rounded leading edge 322, a thickened midsection 324, and a tapered trailing edge 326. Incorporation of airfoil blade members 320 is expected to improve the aerodynamic efficiency of tangential fans, such as those described in connection with FIGS. 2a–2c, 3b, and 4a–4b.

FIG. 4f is a cross-sectional detail view of machined tangential fan structure 400 taken along direction F—F of FIG. 4a. Blade members 414 are shown superimposed on annular hub member 412 having outside circumference 420 and inside diameter 424, disposed concentrically about rotation axis 440. In some embodiments, inside diameters 424 of hub member 412 and blade members 414 are machined such that the inside diameter defined by the plurality of blade members 414 coincides with the inside diameter 424 of substantially annular hub member 412.

The above-described fabrication methods, including monolithic machining, monolithic casting, and welded casting, can also be applied to other tangential fan configurations, such as above-described conventional tangential fan 140.

Figure 5:
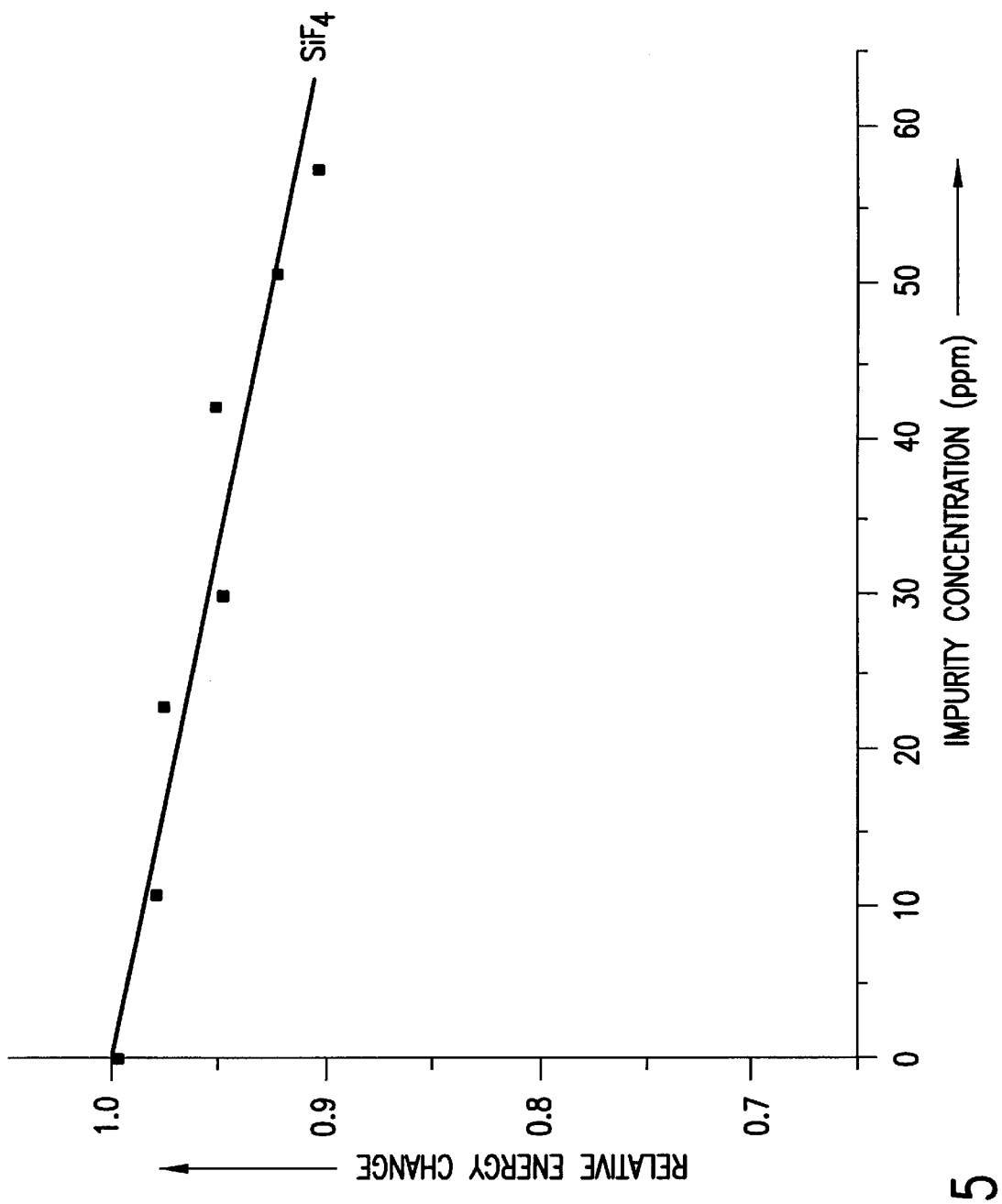
FIG. 5 is a graphical representation of the dependence of relative laser output energy of an excimer laser on concentration for common contaminants.

FIG. 5 is a graphical representation of the dependence of relative laser output energy of an excimer laser on concentration of common contaminants. Relative output energy is displayed along the vertical axis and concentration in parts per million (ppm) is displayed along the horizontal axis. A concentration of approximately 60 ppm of silicon tetrafluoride $SiF_4$ in lasing gas 108 can reduce laser pulse output energy by approximately 8–12 per cent. It has been discovered that braze material typically containing approximately 13 per cent silicon in conventional tangential fan 140 has been a major source of silicon contamination in current excimer laser systems. Silicon (Si) reacts with fluorine ($F_2$) in the lasing gas 108 to form $SiF_4$. Electroless nickel coating is a somewhat porous and imperfect seal and develops microcracks over time, thereby exposing the underlying Si to the reactive fluorine gas mixture. A lasing gas fill, which typically has a working life of several days, starts with a low $SiF_4$ concentration, typically less than 0.3 ppm. With a conventional brazed tangential fan, this level rises to a range of about 15–18 ppm after a period of three days.

Cast, cast-and-welded, or monolithic machined tangential fans, such as those described above in connection with FIGS. 2a–2c, 3b, and 4a–4b require no braze material or other added contaminant-forming material during fabrication and thus are essentially free from Si, greatly reducing the potential adverse effect on laser pulse output energy. Tests performed on a monolithic machined tangential fan 400 provided by the present invention have shown a $SiF_4$ concentration of less than 3 ppm after three days. Cast or cast-and-welded tangential fans 200, 260, 340 provided by the present invention are expected to perform comparably. However, a monolithic machined tangential fan 400 has a polycrystalline alloy structure typical of wrought aluminum, which has lower porosity and therefore avails itself better to sealing with nickel coating relative to cast aluminum alloys. Thus, monolithic machined tangential fan 400 is expected to contribute lower contamination relative to cast or cast-and-welded tangential fans 200, 260, 340. In addition, cast-and-welded fan 340 has large-area flat surfaces inside narrow crevices between adjacent sections 310, that are difficult to clean and evacuate for processing and operation.

In conventional tangential fan 140, significant stiffness against bending moments is provided by hub members 146, without which blade members 144 would be too flexible to be useful above approximately 100 rpm. Hub members 212, 312, 412 of tangential fans 200, 260, 340, 400 in accordance with embodiments of the present invention, also contribute significant structural stiffness. Additionally, monolithic machined, cast, and cast-and-welded tangential fan structures 200, 260, 340, 400 provide greater stiffness relative to conventional brazed tangential fan assembly 140 having individually stamped and formed blade 144 and hub 146 members. Particularly, monolithic tangential fan structure 400 provides precise control of the radiused connections from hub member 412 to blade member 414 and from end flange 416a, 416b to blade member 414. This controlled fillet 418, which adds stiffness, also results in higher bending mode frequencies and correspondingly higher permitted operating speeds, ranging as high as 5,000 or more rpm. The greater stiffness of monolithic machined tangential fan structure 400 also increases the ability of such a tangential fan to resist "aerodynamic buffeting" effects within laser chamber 100.

In particular, embodiments of the invention provide for increasing fan stiffness by optimally selecting the number and longitudinal placement of hub members, such as hub members 146, 212, 312, and 412, in the tangential fan structure. Investigations have shown that the natural frequency of the first bending vibration mode increases as the number of hub members increases. Severe vibrations of the tangential fan occur at rotation rates approximating one-half of the natural frequency of the first bending mode, because the fan structure distorts laterally at each half period of rotation. Whereas in structures typical of previous tangential fans, this limits rotation frequencies to less than a few hundred rpm, optimal selection of the number and longitudinal placement of hub members extends the range of rotation frequencies to 5,000 or more rpm. Therefore, increasing the natural frequency of the first bending mode by optimal selection of the number and longitudinal placement of hub members improves the performance of a tangential fan.

The surface and dimensional control of machined monolithic tangential fan 400 are expected to be more precise than those of a brazed or cast tangential fan. Monolithic machined tangential fan 400 should require only a minimum of balancing and should impart a smoother flow of gas due to blade-to-blade uniformity.

The present invention provides a tangential fan and cutoff assembly that is economical to fabricate and has sufficient mechanical rigidity to allow balancing and post-machining for precision tolerances, and to minimize vibration during operation. Embodiments of the invention reduce aerodynamic buffeting effects and laser pulse output energy fluctuations, and allow shaping of efficient airfoil blade members. Additionally, a tangential fan provided by the present invention does not introduce silicon contamination into the laser chamber. Such a fan is configured to recirculate lasing gas in a laser chamber, particularly an excimer laser chamber, and more particularly a laser chamber of a krypton fluoride or argon fluoride excimer laser, or of a fluorine ($F_2$) molecular gas laser.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An electric discharge laser apparatus comprising:
   a tangential fan configured to recirculate a lasing gas mixture, said tangential fan comprising;
   a rotation axis having a first end and a second end opposite said first end;
   a circumference substantially concentric with said rotation axis;
   a plurality of blade members disposed proximate to said circumference, such that a blade member extends substantially parallel to said rotation axis between said first end and said second end; and
   a cutoff member, said cutoff member being fixed in position and having a tapered edge proximate to a portion of said circumference, such that said tapered edge is oriented diagonally relative to said rotation axis and said plurality of blade members;

wherein said tapered edge oriented diagonally relative to said blade members reduces pulse output fluctuations and aerodynamic buffeting as compared with cutoff members which are parallel to fan blade members.

2. The apparatus of claim 1, wherein said tapered edge comprises two edge segments, said two edge segments being oriented diagonally relative to one another.

3. The apparatus of claim 1, wherein the number of said blade members is an odd integer.

4. The apparatus of claim 1, wherein said blade member has an airfoil cross-sectional shape.

5. The apparatus of claim 1, further comprising a plurality of hub members attached to said blade members, said hub members being disposed substantially transversely relative to said rotation axis, wherein the number and axial placement of said hub members are selected such that the natural frequency of bending mode vibration of said tangential fan is controlled.

6. The apparatus of claim 5, wherein said hub members are selected such that the natural frequency of bending mode vibration of said tangential fan is greater than twice the rotation frequency of said tangential fan.

7. The apparatus of claim 1, wherein the material of said tangential fan is an alloy selected from the group consisting of 6061 aluminum, an aluminum alloy containing additive metals consisting substantially of 3.5–6.5 per cent copper and 0–2.5 per cent nickel, and an aluminum alloy containing additive metals consisting substantially of 3.5–6.5 per cent copper and 0–1.5 per cent silver.

8. The apparatus of claim 1, wherein said electric discharge laser apparatus further comprises a transverse excited molecular laser.

9. The apparatus of claim 8, wherein said molecular laser is selected from the group consisting of argon fluoride excimer lasers, krypton fluoride excimer lasers, and fluorine ($F_2$) molecular lasers.

* * * * *